United States Patent
Kim et al.

(10) Patent No.: US 10,276,419 B1
(45) Date of Patent: Apr. 30, 2019

(54) PICK AND PLACE DEVICE WITH INTERDIGITATED ELECTRODES FOR MICRO SCALE DEVICE

(71) Applicant: Apple Inc., Cupertino, CA (US)

(72) Inventors: Hyeun-Su Kim, Palo Alto, CA (US); Dariusz Golda, Redwood City, CA (US); John A. Higginson, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 301 days.

(21) Appl. No.: 15/183,608

(22) Filed: Jun. 15, 2016

Related U.S. Application Data

(60) Provisional application No. 62/188,971, filed on Jul. 6, 2015.

(51) Int. Cl.
| | |
|---|---|
| H01L 21/683 | (2006.01) |
| B81C 99/00 | (2010.01) |
| H02N 13/00 | (2006.01) |
| B25J 15/00 | (2006.01) |

(52) U.S. Cl.
CPC ........ *H01L 21/6833* (2013.01); *B81C 99/002* (2013.01); *B25J 15/0085* (2013.01); *H01L 2221/68363* (2013.01); *H01L 2924/12041* (2013.01); *H02N 13/00* (2013.01)

(58) Field of Classification Search
USPC .................................................. 361/230, 234
See application file for complete search history.

(56) References Cited

U.S. PATENT DOCUMENTS

| | | | |
|---|---|---|---|
| 5,788,814 A | 8/1998 | Sun et al. | |
| 8,415,767 B1 * | 4/2013 | Golda | B81C 99/002 |
| | | | 257/619 |
| 2007/0134835 A1 | 6/2007 | Fukuda et al. | |
| 2013/0120415 A1 | 5/2013 | Zuo et al. | |
| 2014/0159324 A1 * | 6/2014 | Golda | H02N 13/00 |
| | | | 279/128 |

* cited by examiner

*Primary Examiner* — Danny Nguyen
(74) *Attorney, Agent, or Firm* — Jaffery Watson Mendonsa & Hamilton LLP

(57) ABSTRACT

A compliant electrostatic transfer head and array are described. In an embodiment a compliant electrostatic transfer head includes a base substrate, and a plurality of interdigitated spring electrodes that are deflectable together into a cavity toward the base substrate. Each spring electrode includes mesa structure, and the mesa structures of the plurality of interdigitated spring electrodes are aligned.

20 Claims, 5 Drawing Sheets

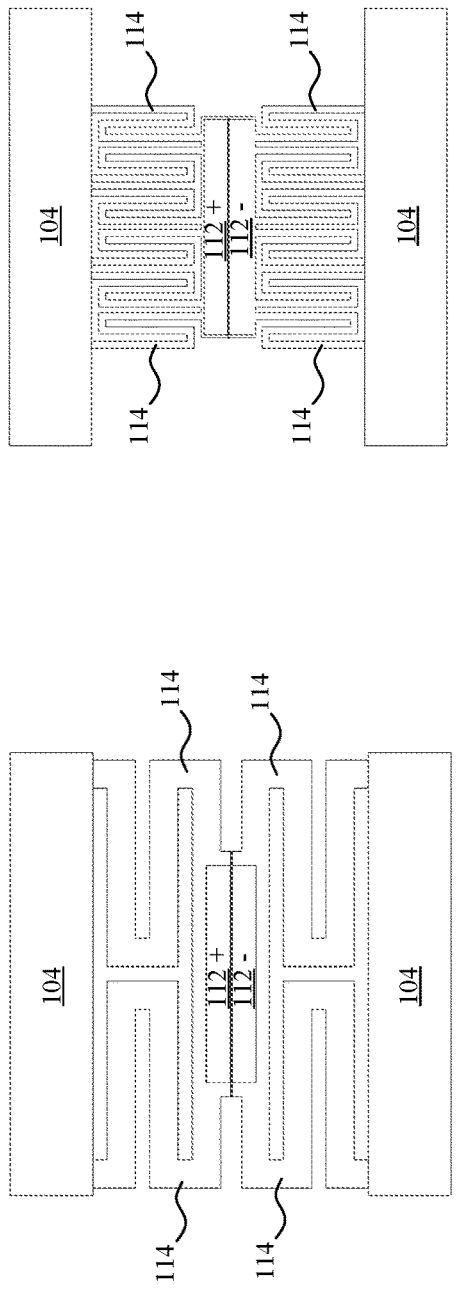
FIG. 9
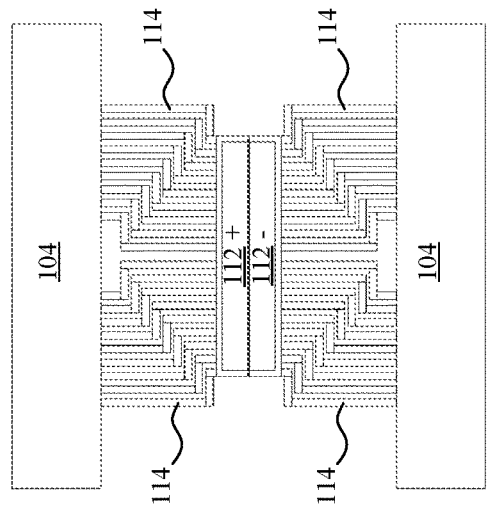
FIG. 10
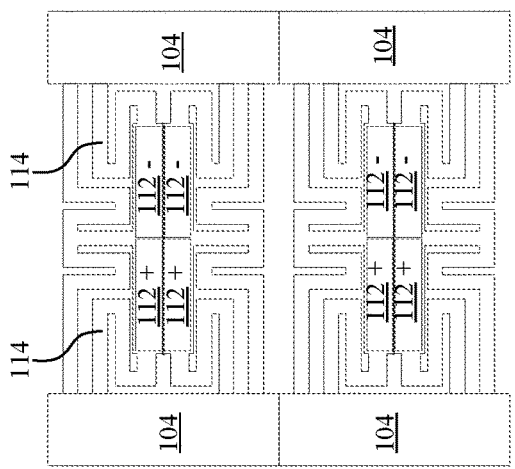
FIG. 11
FIG. 12

PICK AND PLACE DEVICE WITH INTERDIGITATED ELECTRODES FOR MICRO SCALE DEVICE

RELATED APPLICATIONS

This application claims the benefit of priority of U.S. Provisional Application No. 62/188,971 filed Jul. 6, 2015, which is incorporated herein by reference.

BACKGROUND

Field

Embodiments described herein relate to a compliant electrostatic transfer head array to transfer an array of devices to a receiving substrate.

Background Information

The feasibility of commercializing miniature devices such as radio frequency (RF) microelectromechanical systems (MEMS) microswitches, light-emitting diode (LED) display systems, and MEMS or quartz-based oscillators is largely constrained by the difficulties and costs associated with manufacturing those devices. Miniaturized device manufacturing processes typically include processes in which miniaturized devices are transferred from one wafer to another. In one such implementation, a transfer wafer may pick up an array of miniaturized devices from a donor wafer and bond the miniaturized devices to a receiving wafer. Other proposed technologies for transferring of miniaturized devices include transfer printing with elastomeric stamps and electrostatic transfer with electrostatic transfer heads.

SUMMARY

Compliant electrostatic transfer heads with interdigitated spring electrodes are described. In an embodiment, a compliant electrostatic transfer head includes a base substrate, and a plurality of interdigitated spring electrodes that are deflectable together into a cavity toward the base substrate. Each spring electrode includes a mesa structure. In an embodiment, the mesa structures of the plurality of interdigitated spring electrodes are aligned, for example, in a row. In an embodiment, each mesa structure includes a top surface with a maximum dimension of 1 to 100 µm. When the mesa structures are aligned in a row, the row may have a maximum dimension of greater than 100 µm in an embodiment. Thus, various arrangements of various segmented mesa structures can be achieved to provide a contact surface for the compliant electrostatic transfer head that is greater than that of a single mesa structure. A dielectric material covers the top surfaces of the mesa structures. A second dielectric material, which may be the same as the dielectric material, may also be laterally between adjacent mesa structures.

Each interdigitated spring electrode may include a spring arm extending from a bus bar, and a spring platform directly underneath a corresponding mesa structure. In an embodiment, a first interdigitated spring electrode is electrically coupled with a first bus bar, and a second interdigitated spring electrode is electrically coupled with a second bus bar that is electrically insulated from the first bus bar.

In an embodiment, the first interdigitated spring electrode extends from the first bus bar across the cavity, and the second interdigitated spring electrode extends from the second bus bar across the cavity. In one embodiment, the mesa structure of the first interdigitated spring electrode is located along an axial midpoint of the corresponding spring arm of the first interdigitated spring electrode, and the mesa structure of the second interdigitated spring electrode is located is located along an axial midpoint of the corresponding spring arm of the second interdigitated spring electrode. The first bus bar, second bus bar, first interdigitated spring electrode, and second interdigitated spring electrode are formed in a device layer that is located over an insulating layer. A first groove may be formed in the device layer to electrically separate the second interdigitated spring electrode from the first bus bar, and a second groove may be formed in the device layer to electrically separate the first interdigitated spring electrode from the second bus bar.

In an embodiment, the spring platform of the first interdigitated spring electrode is interdigitated with the spring platform of the second interdigitated spring electrode. In one embodiment, a first plurality of mesa structures supported by the first spring platform is aligned, e.g. in a row, with a second plurality of mesa structures supported by the second spring platform. The first bus bar, second bus bar, first interdigitated spring electrode, and second interdigitated spring electrode are formed in a device layer that is located over an insulating layer. The insulating layer may span completely directly underneath the first spring platform and the second spring platform.

In accordance with embodiments, a transfer head array may include a base substrate, and an array of compliant electrostatic transfer heads. Each compliant electrostatic transfer head may include a group of interdigitated spring electrodes that is deflectable together into a cavity toward the base substrate. Each spring electrode may include a mesa structure, and the mesa structures are aligned, for example, in a row. In an embodiment, the transfer head array includes a first bus bar and a second bus bar, and the group of interdigitated spring electrodes for a plurality of the array of compliant electrostatic transfer heads extends between the first bus bar and the second bus bar. For example, the group interdigitated spring electrodes may extend entirely across the cavity or only partially across the cavity. Each of the plurality of the array of compliant electrostatic transfer heads may be deflectable into a single cavity, or separate cavities, between the first bus bar and the second bus bar.

BRIEF DESCRIPTION OF THE DRAWINGS

FIGS. 9-16 are schematic top view illustrations of compliant electrostatic transfer head configurations in accordance with embodiments.

DETAILED DESCRIPTION

Figure 1:
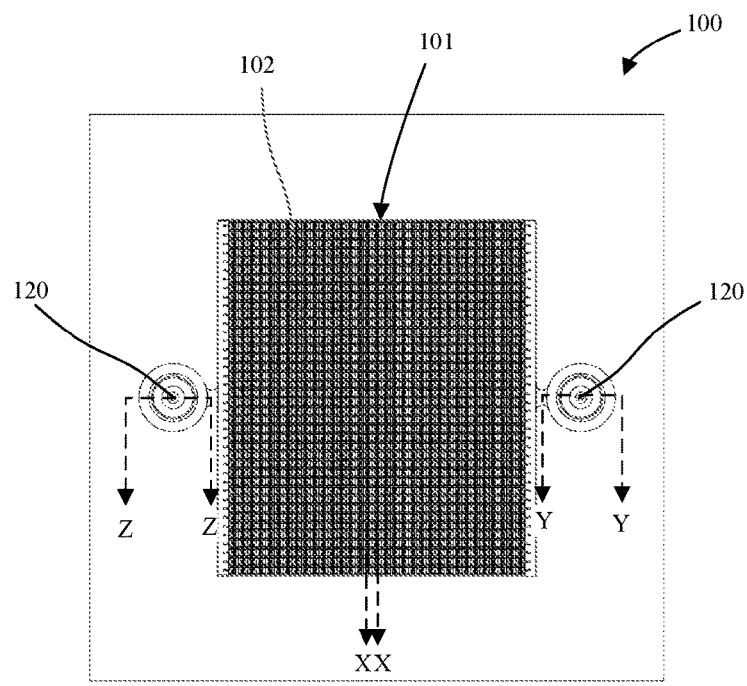
FIG. 1 is a top view illustration of a pick up array in accordance with an embodiment

Embodiments describe compliant electrostatic transfer heads with interdigitated spring electrodes for the transfer of micro scale devices to a receiving substrate. In an embodiment, a compliant electrostatic transfer head includes a base substrate, and a plurality of interdigitated spring electrodes that are deflectable together into a cavity toward the base substrate. Each spring electrode includes a mesa structure. In an embodiment, the mesa structures of the plurality of interdigitated spring electrodes are aligned in a row. In this aspect, plurality of mesa structures can be aligned to provide a cumulative contact area for the electrostatic transfer head. A plurality of interdigitated spring electrodes may be coupled to and extend between a pair of bus bars, for example, to form a bipolar electrode configuration.

Without being limited to a particular theory, embodiments describe compliant electrostatic transfer heads which operate in accordance with principles of electrostatic grippers, using the attraction of opposite charges to pick up micro devices. In accordance with embodiments, a pull-in voltage is applied to an electrostatic transfer head in order to generate a grip pressure on a micro device and pick up the micro scale device. For example, the electrostatic transfer head may include a bipolar electrode configuration. The compliant electrostatic transfer head and head arrays in accordance with embodiments may be used to transfer micro devices such as, but not limited to, diodes, LEDs, transistors, MEMS, integrated circuits (ICs) for logic, memory or LED drivers, and gallium arsenide (GaAs) circuits for radio frequency (RF) communications from a carrier substrate to a receiving substrate such as, but is not limited to, a display substrate, a lighting substrate, a substrate with functional devices such as transistors or ICs, or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment," "an embodiment" or the like means that a particular feature, structure, configuration, or characteristic described in connection with the embodiment is included in at least one embodiment. Thus, the appearances of the phrase "in one embodiment," "an embodiment" or the like in various places throughout this specification are not necessarily referring to the same embodiment. Furthermore, the particular features, structures, configurations, or characteristics may be combined in any suitable manner in one or more embodiments.

The terms "over", "to", "spanning", "between" and "on" as used herein may refer to a relative position of one layer with respect to other layers. One layer "over", "spanning" or "on" another layer or bonded "to" another layer may be directly in contact with the other layer or may have one or more intervening layers. One layer "between" layers may be directly in contact with the layers or may have one or more intervening layers.

The term "micro" scale as used herein may refer to the descriptive size of certain devices or structures in accordance with embodiments. As used herein, the terms "micro" scale devices or structures are meant to refer to the scale of 1 to 300 µm, for example, each micro scale device or electrostatic transfer head including a contact surface with primary dimensions such as minimum length or width of 1 to 300 µm. Thus, the primary dimensions do not refer to irregular or insubstantial edges or corners, and instead refer to the primary length or width contributing to the active area of the structure. In an embodiment, each electrostatic transfer head may include a row of mesa structures with an edge (e.g. length or width) having a minimum dimension of 1 to 300 µm. In an exemplary embodiment, a contact surface of a mesa group (e.g. row of mesa structures) for an electrostatic transfer head is approximately 150 µm by 30 µm. In an embodiment, the mesa group to mesa group pitch between adjacent transfer heads is 300 µm.

In some exemplary embodiments, arrays of micro scale devices (e.g. micro chips) which are poised for pick up are described as having a rectangular shape (in x and/or y dimensions) with one dimension being larger than the other, such as one dimension (e.g. length) being larger than 100 µm, and the other dimension (e.g. width) being less than 50 µm. A transfer tool including an array of compliant electrostatic transfer heads matching an integer multiple of a pitch of the corresponding array of micro scale devices on a carrier substrate can be used to pick up and transfer the array of micro scale devices to a receiving substrate. In this manner, it is possible to integrate and assemble micro scale devices into heterogeneously integrated systems, including substrates of any size ranging from micro displays to large area displays, and at high transfer rates.

In one aspect, the mesa structures provide support for the operable contact surface for the compliant electrostatic transfer head. In order to provide sufficient charge separation on the micro scale device being transferred, the mesa structures are arranged in interdigitated blocks with alternating polarity of potential in each block. For example, the mesa structures may be arranged in a row. The arrangement of the interdigitated mesa structure blocks may provide for increased electrostatic force of the transfer heads for the transfer of large micro scale devices.

In another aspect, the spring electrodes may function to provide compliance of the electrostatic transfer heads, and to provide electric potentials to the mesa structure for electrostatic actuation. Due to the size of the micro scale devices being transferred, not only is a threshold electrostatic force generated, a sufficient spring stiffness is also integrated into the transfer heads. In one embodiment, parallel interdigitated spring electrodes, supported on opposite sides of a cavity, may be used for increased spring stiffness. In another embodiment, the interdigitated spring electrodes may assume a non-linear shape in order to increase compliance.

Referring now to FIG. 1, a top view illustration is provided of a pick up array 100 in accordance with an embodiment. As shown, the pick up array 100 includes an active area 101 including an array of compliant electrostatic transfer heads 102 and voltage source contacts 120. The voltage source contacts 120 may be electrically coupled with an array of bus bars to supply operating voltages to the array of compliant electrostatic transfer heads 102.

Figure 2:
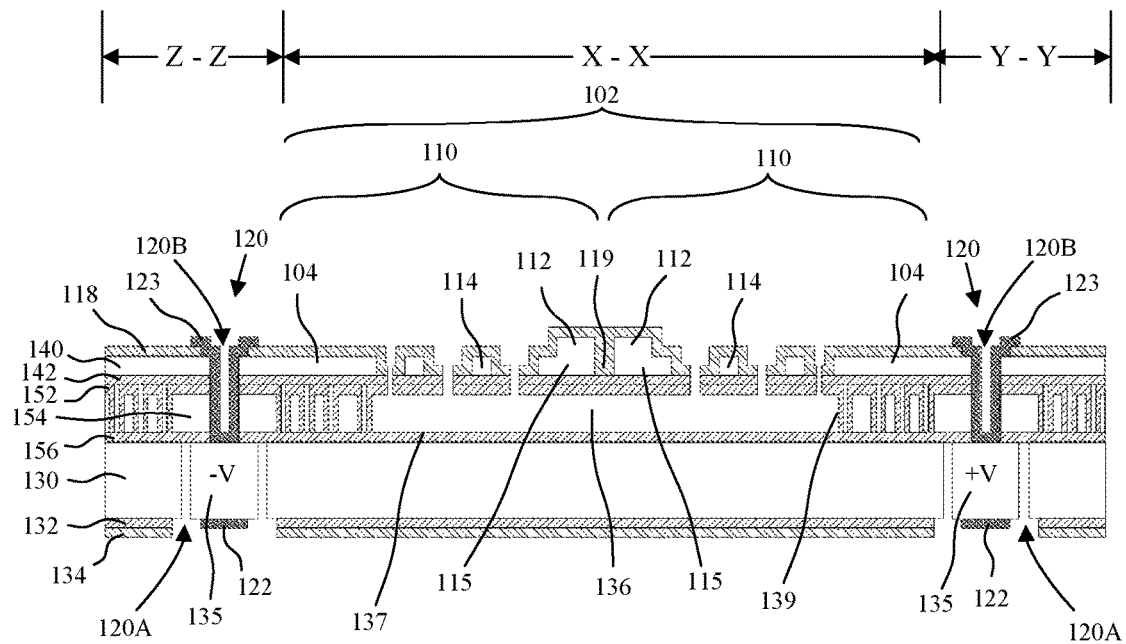
FIG. 2 is a combination cross-sectional side view illustration of various areas of a pick up array in accordance with an embodiment.

FIG. 2 is a combination cross-sectional side view illustration of various areas of a pick up array 100 in accordance with an embodiment. The combination view is not a representation of the precise relative locations for all of the different features illustrated, rather the combination view combines specific features at different locations, such as illustrated in FIG. 1, in order to more easily represent the particular features. While the combination cross-sectional side view illustration shows one voltage source contact 120 corresponding to one spring electrode 110, when viewed in the context of the active area 101 in FIG. 1, it is apparent that one voltage source contact 120 may be electrically connected with a plurality of spring electrodes 110 along one or more bus bars 104. As illustrated, lines Z-Z and Y-Y are along voltage source contacts 120. As illustrated, line X-X is across a bipolar compliant electrostatic transfer head including a pair of spring electrodes 110 over a cavity 136. One or more cavities 136 may be formed around and beneath all spring electrodes 110, and between bus bars 104.

A spring electrode 110 includes a mesa structure 112 and a spring arm 114, where the mesa structure 112 is an elevated portion of the spring electrode 110. Each spring electrode 110 may additionally include a spring platform 115 directly underneath a corresponding mesa structure 112. For example, the spring platform 115 and mesa structure 112 may be integrally formed from the device layer 140. In an embodiment, the mesa structures 112 and spring platforms 115 for each spring electrode 110 may be separated by a trench with a width of 1 µm or less. A dielectric layer 118 may cover a top and side surfaces of the pair of spring electrodes 110 and bus bars 104. The dielectric layer 118 may also cover a side surface of the mesa structures 112 within the trench laterally between the pair of mesa structure 112 for the pair of spring electrodes 110 in a bipolar compliant electrostatic transfer head 102. As illustrated, the dielectric layer 118 may form a dielectric joint 119 that fills the trench laterally between the pair of mesa structures 112. Since the dielectric joint 119 connects the spring electrodes 110, the bipolar electrode assembly illustrated in FIG. 2 is characterized as a beam structure spanning between bus bars 104, in which the joined beam structure is deflectable toward cavity 136.

The bipolar compliant electrostatic transfer head includes a base substrate 130, a cavity template layer 154 on the base substrate, and a first confinement layer 156 between the base substrate 130 and the cavity template layer 154. A patterned device layer 140 is on the cavity template layer 154 and includes a pair of spring electrodes 110 that are deflectable toward the cavity 136. Each spring electrode 110 includes a spring arm 114 that is integrally formed with a mesa structure 112 that protrudes above the corresponding spring arm 114. In an embodiment, each mesa structure 112 is approximately 15 µm tall, corresponding to the thickness of device layer 140 after the formation of mesa etch masks 144 described in further detail below, and the spring arms 114 are approximately 5 µm thick. These dimensions are exemplary, and other dimensions are contemplated.

In the particular embodiment illustrated, an insulating layer 142 is bonded to a second confinement layer 152. For example, the layers 142, 152 may be an oxide-oxide layer bond formed during fabrication of the layer stack. Insulating layer 142 (and confinement layer 152) may electrically insulate the patterned device layer 140 from the underlying layers. The spring electrodes 110 form an electrode beam profile that is deflectable toward the cavity 136.

In accordance with embodiments the pick up array 100 may be formed from silicon-on-insulator (SOI) stack structures. For example, layers 130, 154, 140 may comprise silicon, with the layers 156, 152, 142 between silicon layers 130, 154, 140 comprising silicon oxide.

The cavity 136 may be defined by the first confinement layer 156 and second confinement layer 152, with the first confinement layer 156 forming the bottom surface 137 of the cavity 136 and the second confinement layer 152 forming sidewalls 139 of the cavity 136. Cavity 136 sidewalls 139 may be substantially vertical in an embodiment. The second confinement layer 152 may span along a top surface of the cavity template layer 154 and directly above the cavity 136, and additionally span along sidewalls of the patterned cavity template layer 154.

Via openings 120A may extend through the base substrate 130 from a backside of the base substrate. In the particular embodiment illustrated, via openings 120A terminate at a bottom surface of the first confinement layer 156. A via plug 135 is formed within via opening 120A. With such configuration via plug 135 is electrically insulated from the base substrate 130.

A top side via opening 120B may be formed over the backside via opening 120A. In the embodiment illustrated the top side via opening 120B is filled with top conductive contact 123 (e.g. metallic material). In the particular embodiment illustrated, top side via opening 120B is formed through the patterned device layer 140, insulating layer 142, second confinement layer 152, cavity template layer 154, and first confinement layer 156 in order for top conductive contact 123 to provide an electrical connection to plug 135. In an embodiment, in addition to being formed within top side via openings 120B, top side conductive contact 123 is also formed on an exposed top surface of the device layer 140. In this manner, partially forming conductive contacts 123 over the top surface of the device layer 140 can provide greater surface area for ohmic contact with the silicon bus bars 104. In an embodiment, via plug 135 is formed from the base substrate 130, and provides for an electrical connection with top conductive contact 123. In this manner, a first via plug 135 is electrically coupled to a first array of bus bars 104, and a second via plug 135 is electrically coupled to a second array of bus bars 104. Collectively, openings 120A, 120B conductive contacts 122, 123, and via plug 135 are referred to herein as voltage source contact 120. Backside passivation layers 132, 134 (e.g. oxide or nitride) may be formed on a back side of the base substrate 130.

Still referring to FIG. 2, in an embodiment the dielectric layer 118 is formed on top and side surfaces of the patterned device layer 140, including top and side surfaces of the mesa structures 112. In an embodiment, the dielectric layer 118 functions to provide the desired dielectric constant and/or dielectric breakdown strength, and resultant pick-up pressure of the compliant electrostatic transfer head. In an embodiment, dielectric layer 118 is atomic layer deposition (ALD) $SiO_2$, $Al_2O_3$, $Ta_2O_5$, $HfO_2$, $Si_3N_4$, or $RuO_2$. Dielectric layer 118 may also be form a dielectric joint 119 laterally between the adjacent mesa structures 112, as well as laterally between adjacent spring platforms 115.

In another embodiment, an optional second dielectric layer may be formed over dielectric layer 118 to provide the desired capacitance. In such an optional arrangement, dielectric layer 118 can provide alternative or additional functions, such as an etch protection layer. In such an embodiment, dielectric layer 118 is formed of a nitride material. In an embodiment, the second dielectric layer has a higher dielectric constant and/or dielectric breakdown strength than the dielectric layer 118. In an embodiment, dielectric layer 118 is a deposited silicon nitride ($SiN_x$), and second dielectric layer is atomic layer deposition (ALD) $SiO_2$, $Al_2O_3$, $Ta_2O_5$, $HfO_2$, $Si_3N_4$, or $RuO_2$.

Still referring to FIG. 2, the compliant electrostatic transfer head 102 may include a plurality of interdigitated spring electrodes 110 that are deflectable together into a cavity 136 toward the base substrate. Each interdigitated spring electrode 110 includes a spring arm 114 extending from a bus bar 104, and a spring platform 115 directly underneath a corresponding mesa structure 112. In an embodiment, the plurality of interdigitated spring electrodes 110 includes a first interdigitated spring electrode 110 electrically coupled with a first bus bar 104 (e.g. to a positive voltage source), and a second interdigitated spring electrode 110 electrically coupled with a second bus bar 104 (e.g. to a negative voltage source). The first and second bus bars 104 are electrically insulated from one another so that they may apply opposite voltages at a particular point in time.

Figure 3:
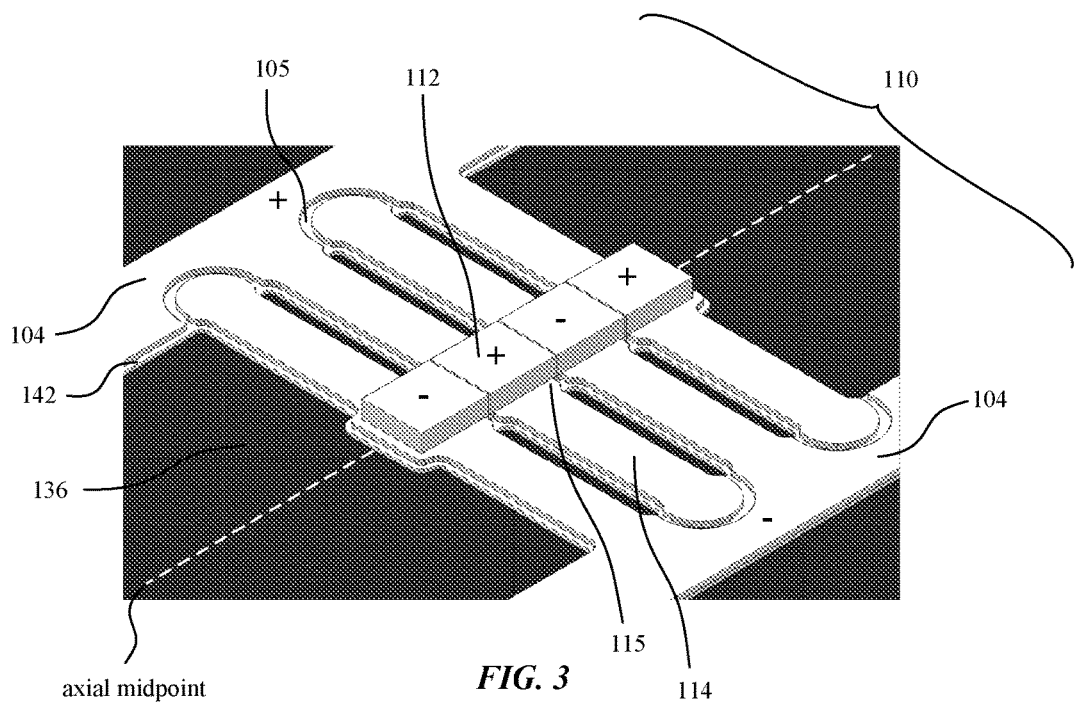
FIG. 3 is an isometric view illustration of a single compliant electrostatic transfer head in accordance with an embodiment.

FIG. 3 is an isometric view illustration of a compliant electrostatic transfer head in accordance with an embodiment. In the embodiment illustrated, two first interdigitated spring electrodes 110 extend from a first bus bar 104 (e.g. connected with a positive voltage source) across the cavity 136, and two second interdigitated spring electrodes 110 extend from a second bus bar 104 (e.g. connected with a negative voltage source) across the cavity 136. Though, more or less interdigitated spring electrodes 110 may be included. The mesa structures of the one or more first and second interdigitated spring electrodes 110 may be located along axial midpoints of the corresponding spring arms. In the embodiment illustrated, the mesa structures 112 of the interdigitated spring electrodes 110 are arranged in a row. For example, the row may be centered, at an axial midpoint of the interdigitated spring electrodes 110 above the cavity 136. The interdigitated spring electrodes 110 may be arranged in a variety of configurations, for example, with every other mesa structure 112 connected to the same voltage source.

The spring platforms 115 directly underneath the corresponding mesa structures 112 may also be aligned, for example in row centered along the axial midpoint above the cavity. As shown, the insulating layer 142 is located directly underneath each of the spring platforms and corresponding mesa structures 112, and also spans laterally between the adjacent spring platforms 115 which are physically and electrically separate from each other. As shown in FIG. 2, trenches between adjacent mesa structures 112 and spring platforms 115 can be filled with a dielectric material, which may form a dielectric joint 119. In an embodiment, dielectric joint 119 is formed of the dielectric layer 118 that also covers the top surfaces of the mesa structures 112, and optionally other structures of device layer 140.

Figure 4:
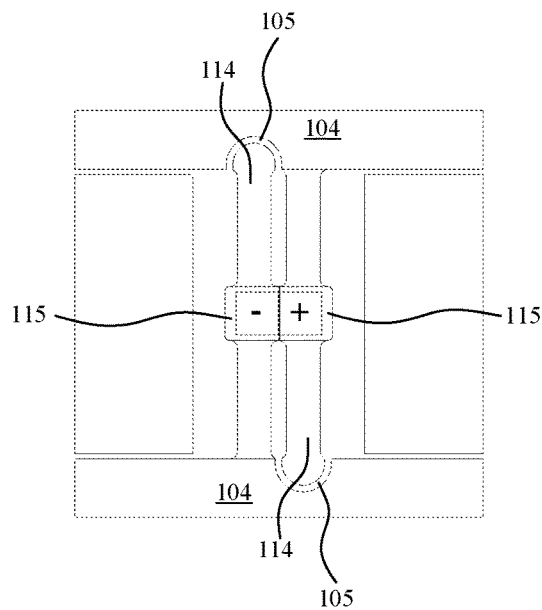
FIGS. 4-5 are schematic top view illustrations of various compliant electrostatic transfer head structures in accordance with embodiments.
Figure 5:
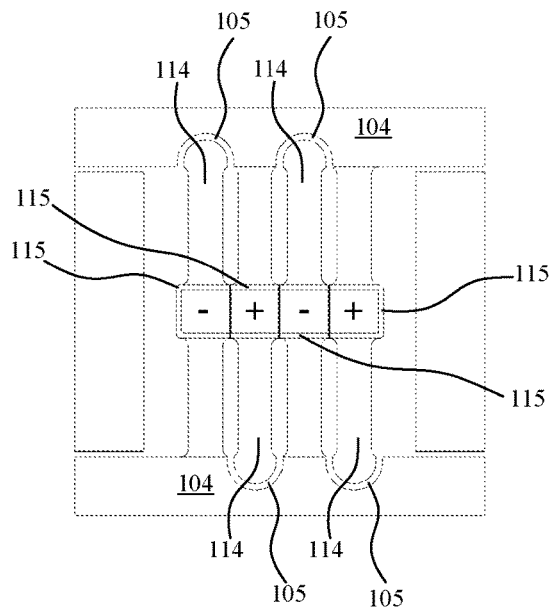

In one aspect, embodiments including interdigitated spring electrodes 110 extending (e.g. completely) across the cavity 136 may provide for additional structural support while at the same time increasing the contact surface area by virtue of the addition of mesa structures 112, for example, by increasing a length of the row of mesa structures 112. As shown, the interdigitated spring electrodes 110 may be supported on both sides of the cavity 136, where the ends of the spring arms 114 are supported by the underlying insulating layer 142 on opposite sides of the cavity 136. For example, this may be accomplished by etching grooves 105 in the device layer 140 to electrically separate the spring arms 114 from the opposite bus bars 104. FIGS. 4-5 are schematic top view illustrations of various compliant electrostatic transfer head 102 structures. As shown, the number of segmented mesa structures with alternating polarity of potentials can be varied to achieve a specified contact area. Spring stiffness may be increased by increasing the width or thickness of the spring arms 114, reducing the separation distance between spring arms 114, and/or reducing the axial length of the spring arms 114, and vice versa.

Figure 6:
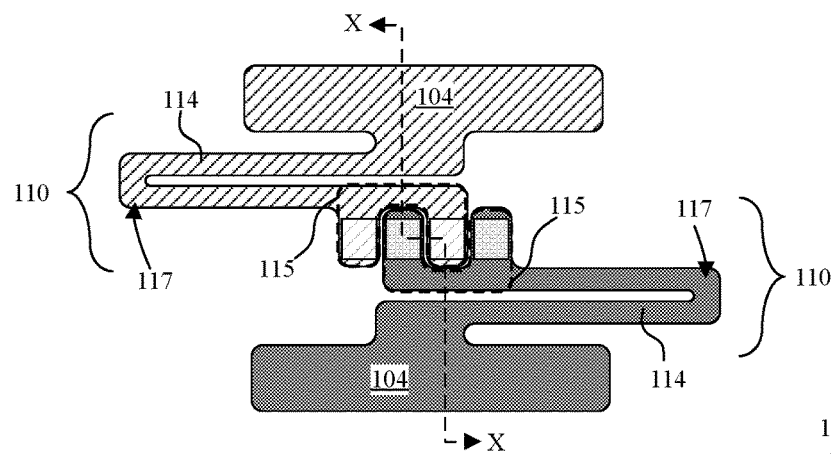
FIGS. 6-7 are close-up schematic top view illustrations of single compliant electrostatic transfer heads with interdigitated spring platforms in accordance with embodiments.
Figure 7:
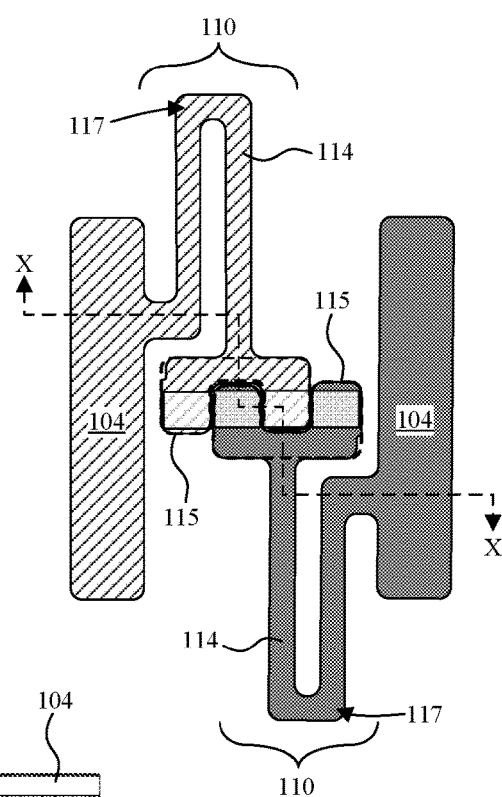
Figure 8:
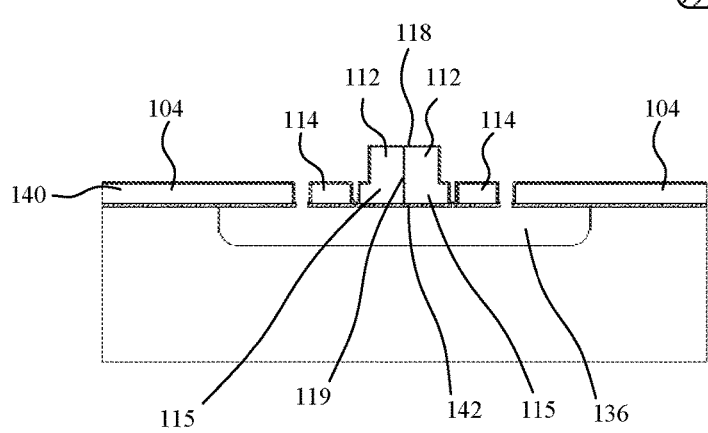
FIG. 8 is a close-up cross-sectional side view illustration of a compliant electrostatic transfer head along line X-X of FIG. 6 or FIG. 7 in accordance with an embodiment.
Figure 13:
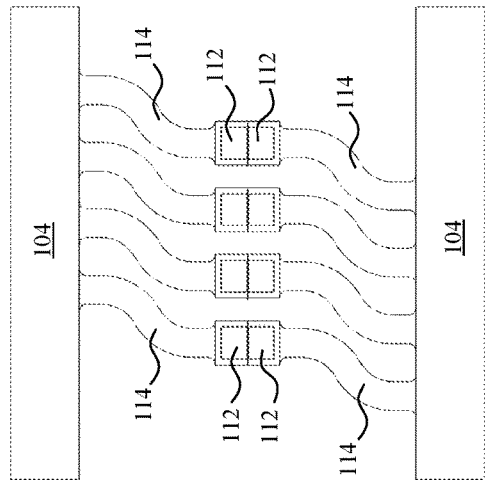
Figure 14:
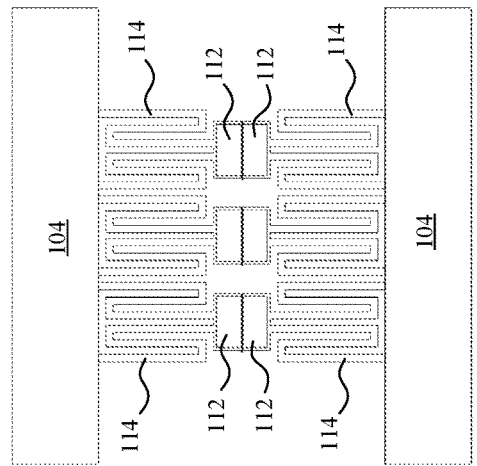
Figure 15:
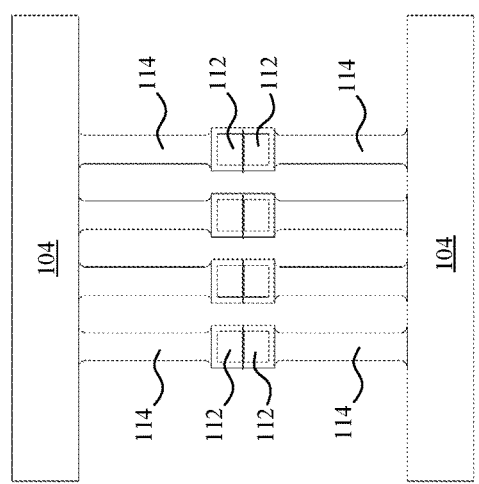
Figure 16:
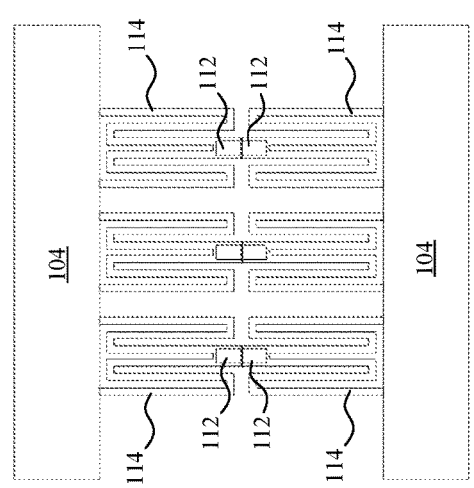

FIGS. 6-7 are close-up schematic top view illustrations of single compliant electrostatic transfer heads with interdigitated spring platforms in accordance with embodiments. FIG. 8 is a close-up cross-sectional side view illustration of a compliant electrostatic transfer head along line X-X of FIG. 6 or FIG. 7 in accordance with an embodiment. The compliant electrostatic transfer head illustrated in FIG. 6 is similar to that illustrated in FIG. 2, including bus bars 104 spring arms 114, spring platforms 115, and mesa structures 112 formed in a device layer 140.

In the embodiments illustrated in FIGS. 6-7 the spring platforms 115 of the separate interdigitated spring electrodes 110 are interdigitated. As shown, the interdigitated spring electrodes 110 are supported on a single side of the cavity 136, where each interdigitated spring electrodes 110 extends from a corresponding bus bar 104. In an embodiment, a plurality of interdigitated spring electrodes 110 includes a first interdigitated spring electrode 110 electrically coupled with a first bus bar 104, and a second interdigitated spring electrode 110 electrically coupled with a second bus bar 104 that is electrically insulated from the first bus bar 104. A first plurality of mesa structures 112 supported by a first spring platform 115 of the first interdigitated spring electrode 110, and a second plurality of mesa structures 112 supported by a second spring platform 115 of the second interdigitated spring electrode 110 may be aligned, for example in a row. In the embodiment illustrated in FIG. 7, the row of mesa structures 112 may be parallel with the bus bars 104. In the embodiment illustrated in FIG. 8, the row of mesa structures 112 may be orthogonal with the bus bars 104.

The spring platforms 115 directly underneath the corresponding mesa structures 112 may also be aligned, for example in row. As shown, the insulating layer 142 is located directly underneath each of the spring platforms and corresponding mesa structures 112, and also spans laterally between the adjacent spring platforms 115 which are physically and electrically separate from each other. As shown in FIG. 8, trenches between adjacent mesa structures 112 and spring platforms 115 can be filled with a dielectric material, which may form a dielectric joint 119. In an embodiment, dielectric joint 119 is formed of the dielectric layer 118 that also covers the top surfaces of the mesa structures 112, and optionally other structures of device layer 140. Dielectric joint 119 may alternatively be formed of a separate layer, or material.

The spring arms 114 may include one or more bends 117. The bends 117 may assume a variety of configurations, such as switch-backs (90 degree bends) as illustrated. Increasing the length of the spring arms 114 may be achieved by the inclusion of bends 117, for example, to increase the flexibility and compliance of the electrostatic transfer head.

In accordance with embodiments, a transfer head array may include a base substrate, and an array of compliant electrostatic transfer heads 102 such as those illustrated with regard to FIGS. 2-8. Each compliant electrostatic transfer head 102 may include a group of interdigitated spring electrodes 110 that is deflectable together into a cavity toward the base substrate. Each spring electrode may include a mesa structure, and the mesa structures are aligned, for example, in a row. In an embodiment, the transfer head array includes a first bus bar and a second bus bar, and the group of interdigitated spring electrodes for a plurality of the array of compliant electrostatic transfer heads extends between the first bus bar and the second bus bar. For example, the group interdigitated spring electrodes may extend entirely across the cavity (e.g. FIGS. 3-5) or only partially across the cavity (e.g. FIGS. 6-8). Each of the plurality of the array of compliant electrostatic transfer heads may be deflectable into a single cavity, or separate cavities, between the first bus bar and the second bus bar.

In interests of clarity and conciseness, the above description has been made with regard to specific compliant electrostatic transfer head configurations. However, embodiments are not limited to the particular configurations. Additional compliant electrostatic transfer head configurations are illustrated in FIGS. 9-16 in accordance with embodiments. The particular embodiments illustrated, show several variations on spring arm 114 shapes and dimensions that are possible, such as including multiple switchbacks, multiple spring arms, straight spring arms, wavy spring arms. Spacing between spring arms 114 may also be variable.

In utilizing the various aspects of the embodiments, it would become apparent to one skilled in the art that combinations or variations of the above embodiments are possible for forming a complaint electrostatic transfer head and array. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A compliant electrostatic transfer head comprising:
a base substrate; and
a plurality of interdigitated spring electrodes that are deflectable together into a cavity toward the base substrate;
wherein each spring electrode includes mesa structure, and the mesa structures of the plurality of interdigitated spring electrodes are aligned.

2. The compliant electrostatic transfer head of claim 1, wherein each mesa structure includes a top surface.

3. The compliant electrostatic transfer head of claim 1, further comprising a dielectric material covering the top surfaces of the mesa structures.

4. The compliant electrostatic transfer head of claim 3, further comprising a second dielectric material laterally between the mesa structures.

5. The compliant electrostatic transfer head of claim 4, wherein the first and second dielectric materials are the same material.

6. The compliant electrostatic transfer head of claim 1, wherein each interdigitated spring electrode comprises a spring arm, and a spring platform directly underneath a corresponding mesa structure, wherein the spring arm extends from a bus bar.

7. The compliant electrostatic transfer head of claim 6, wherein the plurality of interdigitated spring electrodes includes a first interdigitated spring electrode and a second interdigitated spring electrode, wherein the first interdigitated spring electrode is electrically coupled with a first bus bar and the second interdigitated spring electrode electrically coupled with a second bus bar that is electrically insulated from the first bus bar.

8. The compliant electrostatic transfer head of claim 7, wherein the first interdigitated spring electrode extends from the first bus bar across the cavity, and the second interdigitated spring electrode extends from the second bus bar across the cavity.

9. The compliant electrostatic transfer head of claim 8:
wherein the mesa structure of the first interdigitated spring electrode is located along an axial midpoint of the corresponding spring arm of the first interdigitated spring electrode; and
wherein the mesa structure of the second interdigitated spring electrode is located along an axial midpoint of the corresponding spring arm of the second interdigitated spring electrode.

10. The compliant electrostatic transfer head of claim 9, wherein the first bus bar, the second bus bar, the first interdigitated spring electrode, and the second interdigitated spring electrode are formed in a device layer that is located over an insulating layer.

11. The compliant electrostatic transfer head of claim 10, further comprising:
a first groove formed in the device layer electrically separating the second interdigitated spring electrode from the first bus bar; and
a second groove formed in the device layer electrically separating the first interdigitated spring electrode from the second bus bar.

12. The compliant electrostatic transfer head of claim 7, wherein the spring platform of the first interdigitated spring electrode is interdigitated with the spring platform of the second interdigitated spring electrode.

13. The compliant electrostatic transfer head of claim 12, further comprising a first plurality of mesa structures supported by the first spring platform, and a second plurality of mesa structures supported by the second spring platform, wherein the first and second plurality of mesa structures are aligned in a row.

14. The compliant electrostatic transfer head of claim 13, wherein the first bus bar, the second bus bar, the first interdigitated spring electrode, and the second interdigitated spring electrode are formed in a device layer that is located over an insulating layer.

15. The compliant electrostatic transfer head of claim 14, wherein the insulating layer spans completely directly underneath the first spring platform and the second spring platform.

16. The compliant electrostatic transfer head of claim 7, wherein each mesa structure has a top surface with a maximum dimension of 1 to 100 µm.

17. A transfer head array comprising:
a base substrate; and
an array of compliant electrostatic transfer heads, each compliant electrostatic transfer head comprising:
a group of interdigitated spring electrodes that is deflectable together into a cavity toward the base substrate;
wherein each spring electrode includes mesa structure, and the mesa structures of the plurality of interdigitated spring electrodes are aligned.

18. The transfer head array of claim 17, further comprising a first bus bar and a second bus bar, and the group of interdigitated spring electrodes for a plurality of the array of compliant electrostatic transfer heads extend between the first bus bar and the second bus bar.

19. The transfer head array of claim 18, wherein each of the plurality of the array of compliant electrostatic transfer heads is deflectable into a single cavity between the first bus bar and the second bus bar.

20. The transfer head array of claim 18, wherein each of the plurality of the array of compliant electrostatic transfer heads is deflectable into a separate cavity between the first bus bar and the second bus bar.

\* \* \* \* \*